United States Patent

Kasperkovitz

[15] 3,668,555

[45] June 6, 1972

[54] SEMICONDUCTOR DEVICE FOR PRODUCING OR AMPLIFYING ELECTRIC OSCILLATIONS AND CIRCUIT ARRANGEMENT COMPRISING SUCH A DEVICE

[72] Inventor: Wolfdietrich Georg Kasperkovitz, Emmasingel, Eindhoven, Netherlands

[73] Assignee: U.S. Philips Corporation, New York, N.Y.

[22] Filed: Jan. 14, 1970

[21] Appl. No.: 2,782

[30] Foreign Application Priority Data

Jan. 17, 1969 Netherlands..........................6900787

[52] U.S. Cl.............................331/107 R, 317/234 V, 330/5, 307/317

[51] Int. Cl...........................................................H03b 7/14

[58] Field of Search.....................330/5; 317/234 V; 331/107

[56] References Cited

UNITED STATES PATENTS

| | | | |
|---|---|---|---|
| 3,480,879 | 11/1969 | Nathan et al. | 331/107 G |
| 3,516,019 | 6/1970 | Kroemer et al. | 331/107 G |
| 3,541,401 | 11/1970 | Gunn | 331/107 G |
| 3,467,896 | 9/1969 | Kroemer | 331/107 G |
| 3,490,140 | 1/1970 | Knight et al. | 317/234 V |

*Primary Examiner*—Roy Lake
*Assistant Examiner*—Darwin R. Hostetter
*Attorney*—Frank R. Trifari

[57] ABSTRACT

An electronically tunable semiconductor device for producing and amplifying electric oscillations, comprising between two ohmic contacts at least one thin layer of a low conductivity and a thicker layer of a higher conductivity, with a difference in doping concentration which is smaller than $5 \cdot 10^{10}(\epsilon_0\epsilon_r/q)(E_{av}/v)$, where $E_{av}$ is the field strength with beginning avalanche multiplication, $v$ the saturation velocity of the majority charge carriers, $q$ the electron charge, and $\epsilon_r$ the dielectric constant of the semiconductor material.

10 Claims, 11 Drawing Figures

INVENTOR.
W. G. KASPERKOVITZ
BY
Frank R. Trifari
AGENT

INVENTOR.
W. G. KASPERKOVITZ

BY

Frank R. Trifari

AGENT

INVENTOR.
W. G. KASPERKOVITZ

BY
[signature]
AGENT

SEMICONDUCTOR DEVICE FOR PRODUCING OR AMPLIFYING ELECTRIC OSCILLATIONS AND CIRCUIT ARRANGEMENT COMPRISING SUCH A DEVICE

The invention relates to a semiconductor device for producing or amplifying electric oscillations comprising a body of a semiconductor material of one conductivity type having at least two ohmic connection contacts, said body comprising between said connection contacts at least two layers of the one conductivity type and of different conductivities, the layer having the lower conductivity being thinner than the layer having the higher conductivity.

Within the scope of the invention two layers are considered to be situated between two connection contacts when, if a current flows via the semiconductor body from the one connection contact to the other connection contact, said current flows through said layers in succession in the direction of their thickness.

The invention furthermore relates to a circuit arrangement comprising such a device.

The known semiconductor devices of the type described can be divided into two groups the operation of which is based on quite different physical mechanisms. These groups are known as avalanche diodes and Gunn-effect devices.

In an avalanche diode, as described, for example, in the U.S. Pat. No. 3,324,358 electric oscillations are produced in that a region of negative differential resistance occurs in the current-voltage characteristic of such a diode as a result of an avalanche breakdown. This avalanche breakdown is based on a violent impact ionization and is not exactly reproducible so that devices of this type generally show a comparatively high noise level.

In Gunn-effect devices, as described, for example, in "Electronic Design", Aug. 2, 1966, p.26, the generation of electric oscillations is based on the formation of domains of a high field strength in the layer having the lower conductivity, which domains move from the cathode to the anode through the layer and cause between the anode and the cathode electric oscillations of a frequency which is dependent upon the transit time of the said domains through the layer having the lower conductivity. These Gunn-effect devices can only be manufactured from materials which show a special band structure which enables the occurrence of such domains, for example, GaAs and a few other substances. In addition to this restriction in the choice of material, it is difficult to manufacture Gunn-effect devices. Furthermore, in neither of the described known devices can the frequency of the generated oscillations be controlled in a simple manner.

It is the object of the present invention to provide a semiconductor device for producing or amplifying electric oscillations which is based on another principle and in which the said drawbacks occurring in known devices are avoided or at least considerably reduced, while the frequency of the generated oscillations can be controlled electronically in a very simple manner.

The invention is based on the recognition of the fact that by an efficaceous choice of the difference in doping concentration between the said layers of higher and lower conductivities, a device can be obtained in which in the case of a direct voltage between the connection contacts at which only a moderate avalanche multiplication occurs, electric oscillations can be produced at a frequency which is dependent upon the value of the said direct voltage.

Therefore, according to the invention, a device of the type mentioned in the preamble is characterized in that the difference of the doping concentrations between at least the boundary regions of the said layers facing each other is smaller than $5 \times 10^{10}\ \epsilon_o\ \epsilon_r/q \cdot E_{av}/v$ at/ccm, where $E_{av}$ is the value of the field strength in volt/cm for which in the said semiconductor material the degree of ionization is equal to $1/10d$, where $d$ is the thickness in cm of the layer having the lower conductivity, while $\epsilon_o$ is the dielectric constant of the vacuum in Farad/cm, $\epsilon_r$ the relative dielectric constant of the semiconductor material, $q$ the charge of an electron in Coulombs and $v$ the saturation drift velocity in cm/sec. of the majority charge carriers, and in which one of the connection contacts forms an ohmic connection with the layer having the lower conductivity, the other connection contact forming a non-injecting ohmic connection with the layer having the higher conductivity.

The ionisation degree is to be understood to mean normally the number of electron hole pairs which is liberated by a majority charge carrier per covered cm in the direction of the electric field; see, for example, "Physical Review", vol. 94, 1954, p.877, last paragraph.

The ionization degree $\alpha$ as a function of the field strength has been measured for many semiconductor materials; see, for example, for germanium and silicon Philips, "Transistor Engineering", New York, 1962, p.135, FIGS. 6 to 9. The value of the said field strength $E_{av}$ associated with $\alpha = 1/10d$ for a given semiconductor material can therefore be read as such from said curves by one skilled in the art.

As compared with the said known devices, the device according to the invention has the important advantage that no vehiment impact ionization occurs in contrast with the said known avalanche diodes, so that the noise level is considerably lower. Moreover, as will be described in detail below, the operation is not based on the formation of domains of high field strength, so that in contrast with the said Gunn-effect devices the material choice is not restricted to very special semiconductor materials having a particular band structure. The only condition which the chosen semiconductor material must fulfil is that saturation of the drift velocity of majority charge carriers occurs at a field strength which is lower than the field strength at which avalanche multiplication begins to occur. This is the case with substantially all the semiconductors tested so far.

The operation of the device according to the invention can be explained as follows: When, in a device according to the invention, a direct voltage of such a polarity is applied between the connection contacts that thereby majority charge carriers flow from the layer having the lower conductivity to the layer having the higher conductivity, the current strength, when said direct voltage is increased, will initially increase proportionally to the voltage, the field strength in the layer having the lower conductivity being larger than that in the layer having the higher conductivity. When the field strength in the layer having the lower conductivity exceeds a given value, called the saturation field strength $E_s$ (for electrons in germanium approximately $3 \cdot 10^3$ volt/cm), the drift velocity of the majority charge carriers reaches a saturation value $v$ (for electrons in germanium approximately $6 \cdot 10^6$ cm/sec.). Further increase of the direct voltage results in substantially no further increase of the current strength but does result in a strong increase of the field strength in the layer having the lower conductivity.

After exceeding the saturation field strength $E_s$ in the layer having the lower conductivity, a space charge region is formed in the layer having the higher conductivity on the side of the layer of lower conductivity, in that the majority charge carriers which are sucked away at the connection contact from the layer having the higher conductivity are not sufficiently replenished from the layer having the lower conductivity. This space charge region extends in the layer having the higher conductivity up to the place where the field strength has fallen to the saturation field strength.

When the applied direct voltage is further increased, when a given field strength is reached (for germanium approximately $1.7 \times 10^5$ volt/cm) a beginning of an avalanche multiplication becomes noticeable in the layer having the lower conductivity, where the field strength is always higher than in the layer having the higher conductivity. As a result of this electron-hole pairs are formed, and the extra majority charge carriers traverse the space charge region at the saturation velocity under the influence of the electric field.

These extra majority charge carriers in the space charge region cause variations in the current and in the field strength and hence in the ionization degree. Between the said current- and field strength variations phase differences occur due to the finite transit time of the majority charge carriers across the space charge region. As a result of this delayed feedback coupling, current oscillations may occur at a frequency which is substantially inversely proportional to the transit time of the majority charge carriers across the space charge region. Since the saturation velocity is constant, said transit time furthermore depends substantially only upon the overall thickness D of the space charge region, which in turn depends upon the applied direct voltage, so that the oscillation frequency can be controlled in a simple manner within certain limits by means of the applied direct voltage.

Starting from a simplified unidimensional model, it can be calculated that the oscillation frequency meant here, lies in the proximity of $$q/\epsilon_o \epsilon_r \cdot v/E_{av} \cdot \Delta N \text{ sec}^{-1},$$

where $\Delta N$ is the difference in doping concentration between the layers having the higher and the lower conductivity, and the other quantities have the above-mentioned meanings. Since in the above-described mechanism very strong disturbances occur at frequencies above approximately $5\cdot 10^{10}$ $\text{sec}^{-1}$, because of inter alia diffusion of majority charge carriers in the space charge region, as a result of which oscillation becomes difficult or even impossible, according to the invention, as already described above. $\Delta N$ should be chosen to be $$<5\cdot 10^{10}\ \epsilon_o\ \epsilon_r\ E_{av}/qv \text{ atoms/ccm}.$$

Although the described mechanism can also occur at lower frequencies, the required space charge region below a frequency of approximately $5\cdot 10^8$ $\text{sec.}^{-1}$ should be so wide that for these lower frequencies the use of transistor circuits which give very good satisfaction at these frequencies will generally be preferred. Advantageously the said doping difference between the layers of different conductivities is chosen to be larger than $5\cdot 10^8\ \epsilon_o\ \epsilon_r/q\ E_{av}/v$ at/ccm.

According to an important preferred embodiment, the conductivity of the layer having the higher conductivity is chosen to be maximally ten times larger than that of the layer having the lower conductivity. Therewith the above-mentioned condition for the difference in concentration of the two layers is satisfied for substantially all the known semiconductor materials.

The thickness of the layer having the lower conductivity is advantageously chosen to be as small as possible. The ratio of the highest to the lowest frequency which can be obtained by controlling the applied direct voltage is substantially proportional to the ratio of the maximum and minimum thickness of the space charge region. This ratio, and hence the controllability of the oscillation frequency, is larger according as the thickness of the layer having the lower conductivity is smaller with respect to that of the layer having the higher conductivity.

Another reason why the layer having the lower conductivity is preferably chosen to be as thin as possible is that in this manner unnecessary dissipation as a result of unnecessary voltage drop in said layer is avoided.

Therefore, according to another preferred embodiment of the device according to the invention, the thickness of the layer having the lower conductivity is at most 4 $\mu$m.

The connection contacts which, according to the invention, must be ohmic (non-blocking) and, at least on the layer having the higher conductivity, must be non-injecting, are formed in the most simple manner by highly doped semiconductor regions of the same conductivity type as the said layers having different conductivities. A further preferred embodiment according to the invention is therefore characterized in that the connection contacts are formed by semiconductor regions of the same conductivity type and having a doping concentration which is higher than that of the layer having the higher conductivity, which regions adjoin the layers having different conductivities.

If the semiconductor body consists of germanium or silicon, the doping concentration of the layer having the higher conductivity is preferably chosen to be at most equal to $10^{16}$ at./ccm and at least equal to $10^{14}$ at./ccm. In the case of a very low doping too strong a temperature dependence of the charge carrier concentration and hence of the oscillation frequency occurs, while in the case of higher dopings it presents technical difficulties to obtain the desirable doping difference between the layers.

According to an important preferred embodiment the said layers of different conductivities immediately adjoin each other. As a result of this a very simple structure is obtained.

In circumstances, however, it may be recommendable for the layer having the lower conductivity and the layer having the higher conductivity to be separated from each other by an intermediate layer of the same conductivity type, but with a doping concentration which is higher than that of the layer having the higher conductivity and lower than $\epsilon_o\epsilon_r/aq\ (E_{ar} - E_s)$ atoms/ccm, $\epsilon_o$, $\epsilon_r$, $q$ and $E_{ar}$ have the above-mentioned meanings, while $E_s$ is the value of the field strength in volt/cm for which the saturation drift velocity of the majority charge carriers is reached, and $a$ is the thickness of the intermediate layer in cm. The results of the presence of this intermediate layer is that the voltage drop, so the dissipation, is reduced, while the above-given upper limit of the doping concentration of the intermediate layer, which limit depends upon the thickness of the intermediate layer, ensures that in the operating condition the drift velocity throughout the space-charge region remains equal to the saturation velocity to avoid distortion or damping of the oscillations.

The invention furthermore relates to a circuit arrangement comprising a semiconductor device, as described above, in which a direct voltage is applied between the connection contacts with a polarity such that in the semiconductor body majority charge carriers flow from the layer having the lower conductivity to the layer having the higher conductivity. Said direct voltage is preferably chosen to be high so that the drift velocity of the majority charge carriers, at least in the layer having the lower conductivity, reaches its saturation value and the ionization degree in said layer assumes a value which lies between 1 and 10. As a result of this low ionization degree, a noise occurs which is considerably lower than in the described known devices. In these circuit arrangements the applied direct voltage is preferably chosen to be variable so as to control the oscillation frequency.

In order that the invention may be readily carried into effect, a few embodiments thereof will now be described in greater detail, by way of example, with reference to the accompanying drawings, in which.

Figure 8:
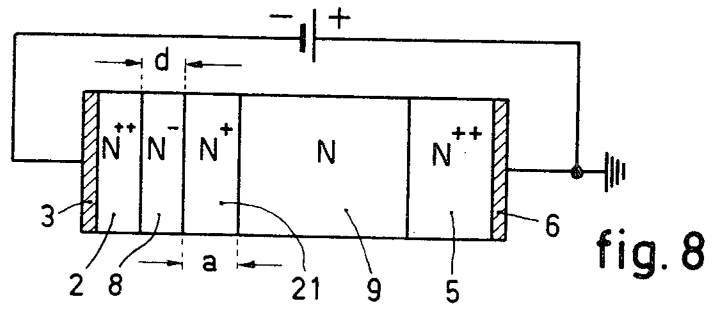
FIG. 8 is a unidimensional model of the device shown in FIG. 7.
Figure 9:
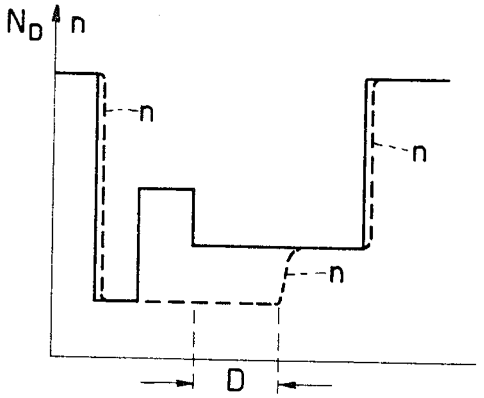
Figure 10:
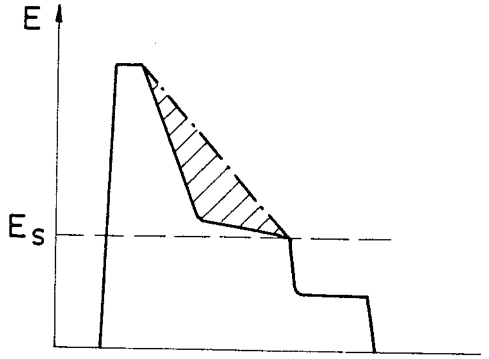
Figure 11:
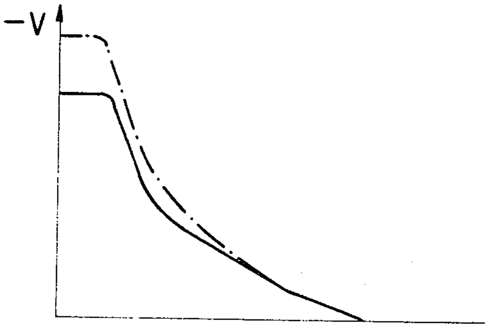

FIGS. 9 to 11 diagrammatically show the variation of the doping, the electron concentration, the field strength and the potential of the device shown in FIG. 8 in the operating condition.

The Figures are diagrammatic and not drawn to scale while for clarity, particularly the dimensions in the direction of the thickness are strongly exaggerated. Corresponding components in the Figures are referred to by the same reference numerals.

Figure 1:
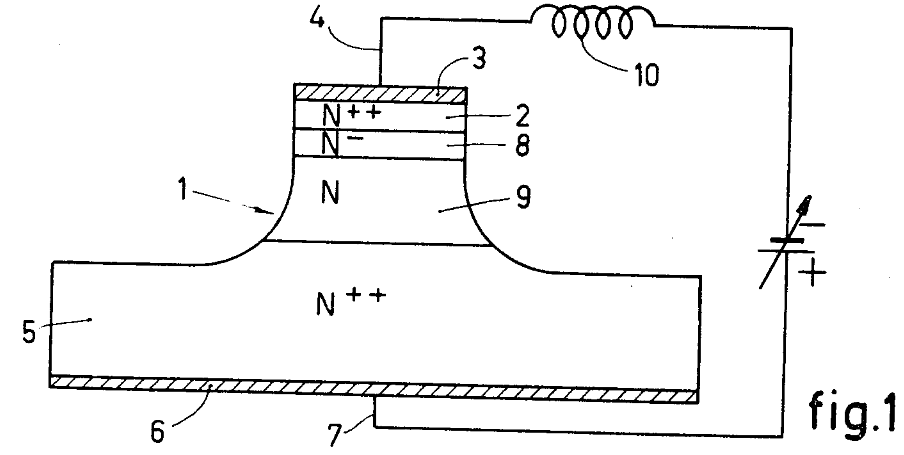
FIG. 1 is a diagrammatic cross-sectional view of a device according to the invention.

FIG. 1 is a diagrammatic cross-sectional view of a semiconductor device according to the invention. This device comprises a semiconductor body 1 of n-type germanium which comprises two ohmic non-injecting connection contacts. The one connection contact consists of a highly doped n-type layer 2 (average donor concentration approximately $10^{18}$ atoms/ccm) on which a metal layer 3 and a connection conductor 4 are situated. The other connection contact consists of a highly doped n-type region 5 (average donor concentration approximately $3 \cdot 10^{17}$ at/ccm) on which a metal layer 6 and a connection conductor 7 are situated.

Between these two connection contacts (2,3) and (5,6) two adjoining n-type layers 8 and 9 having different conductivities are present. In the region adjoining the layer 9, the layer 8 has a doping of $1.5 \times 10^{15}$ at/ccm and a conductivity of approximately 1 $ohm^{-1}$ $cm^{-1}$. In the region adjoining the layer 8, the layer 9 has a doping of $3 \cdot 10^{15}$ at/ccm, and a conductivity of approximately 2 $ohm^{-1}$ $cm^{-1}$. The layer 8 has a thickness $d$ of 1 $\mu$m (= $10^{-4}$ cm), the layer 9 of 20 $\mu$m, the layer 2 of 1 $\mu$m and the region 5 has a thickness of 200 $\mu$m.

The difference between the above-mentioned doping concentrations in the layers 8 and 9 is $1.5 \times 10^{15}$ at/ccm, which difference according to the invention is smaller than $$5 \times 10^{10}\, \epsilon_o\, \epsilon_r/q\; E_{av}/v$$

and larger than $$5 \cdot 10^{8}\, \epsilon_o \epsilon_r/q \cdot E_{av}/v \text{ atoms per ccm.}$$

Actually it holds for n-type germanium that $\epsilon_o = 8 \cdot 85 \cdot 10^{14}$ Farad/m $\epsilon_r = 16$ $q = 1 \cdot 6 \cdot 10^{-19}$ Coulomb while the field strength $E_{ar}$ with an $v = 6 \cdot 10^{6}$ cm/sec (for $E > E_s = 3 \cdot 10^{3}$ Volt/cm), ionization degree of $$\frac{1}{10d} = \frac{1}{10.10^{-4}} = 10^{3}$$

is approximately equal to $1 \cdot 6 \times 10^{5}$ volt/cm, from which it follows that:

$$5 \cdot 10^{10}\, \epsilon_o \epsilon_r/q \cdot E_{av}/v = 1.2 \times 10^{16} \text{ atoms/ccm and}$$

$$5 \cdot 10^{8}\, \epsilon_o \epsilon_r/q \cdot E_{av}/v = 1.2 \times 10^{13} \text{ atoms/ccm.}$$

The above-described device is capable of oscillation when a direct voltage which preferably is variable is applied between the connection contacts 2,3 and 5,6, in which (see FIG. 1) the voltage at the contact 5,6 is positive with respect to that at the contact 2,3 so that electrons move from the layer 8 having the lower conductivity to the layer 9 having the higher conductivity. Oscillation occurs at an overall voltage of approximately 100 volt between the connection conductors 4 and 7. This frequency may vary from approximately $6.6 \times 10^{9}$ $sec^{-1}$ to approximately $3.6 \times 10^{9}$ $sec^{-1}$ by varying the applied direct voltage between approximately 85 volt and approximately 160 volt. At a voltage of 110 volt, the oscillation frequency is approximately $5.1 \times 10^{9}$ $sec.^{-1}$. The electric oscillations can be supplied to a coil 10 (see FIG. 1) the magnetic field of which can be coupled, for example, to that of a wave guide.

Figure 2:
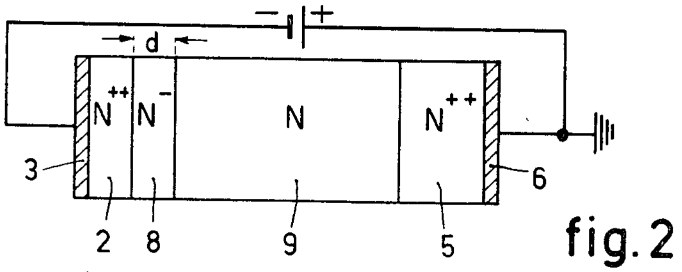
FIG. 2 is a unidimensional model of the device shown in FIG. 1, FIGS. 3 to 5 diagrammatically show the variation of the doping, the electron concentration, the field strength and the potential in the device shown in FIG. 2 in the operating condition.
Figure 3:
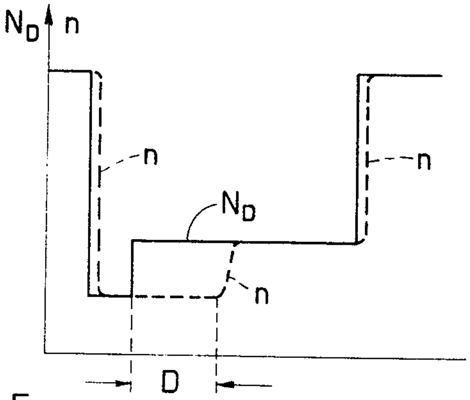
Figure 4:
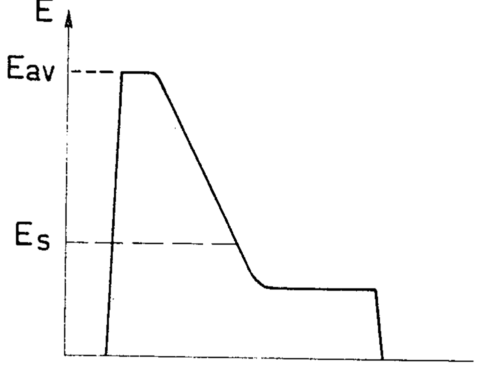
Figure 5:
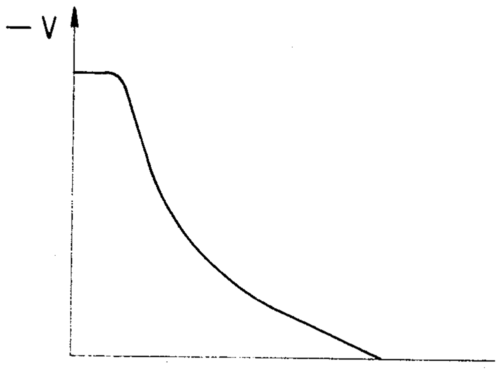

FIG. 2 is a simplified diagrammatic illustration of the structure of the device shown in FIG. 1 as a unidimensional model, while FIGS. 3, 4 and 5 diagrammatically show the donor concentration $N_D$, electron concentration $n$, the field strength $E$ and the potential variation V in the operating condition for this unidimensional model in accordance with the distance to the connection contacts. The space charge region (see FIG. 3) extends over a distance D in the layer 9 having the higher conductivity. This distance D in this example is 12 $\mu$m with a direct voltage of 110 volt across the connection contacts. In the whole space charge region, the field strength is higher than the saturation field strength $E_s$ (see FIG. 4).

The device shown in FIG. 1, can be manufactured, for example, as follows: Starting material is an n-type germanium wafer 5 having a doping of $3 \cdot 10^{17}$ at/ccm, a diameter of 30 mm and a thickness of 250 $\mu$m. A large number of devices according to the invention can be manufactured simultaneously on such a wafer, which devices are then severed in any conventional manner by sawing and/or fracturing. Therefore, the manufacture will hereinafter be described with reference to one single device, in which, therefore, the various mentioned operations are simultaneously applied to all devices of the wafer.

A surface of the said germanium wafer is ground, etched and polished so as to obtain a surface having as little crystal defects as possible. After this operation, the thickness of the wafer is approximately 200 $\mu$m.

An n-type germanium layer 9 is then grown epitaxially on the etched and polished surface in a manner conventionally used in semiconductor technology, which layer has a thickness of 15 $\mu$m and is grown by thermal decomposition of $GeCl_4$ in $H_2$ at a temperature of 880°. The doping of this layer is carried out with arsenic and is $3 \times 10^{15}$ at/ccm. This doping can advantageously be carried out by means of spark doping as is extensively described in J. Goorissen and H.G. Bruining "Philips Technical Review" vol. 26, 1965, pp. 194–207, and a stirring "Solid State Electronics" vol. 10, 1967, pp. 485–490. The doping can be controlled very flexibly by varying the spark frequency which is of advantage particularly in the manufacture of thin layers. However, doping may alternatively be carried out by the addition of activators to the gas to be decomposed, for example, in the form of hybrid.

A second n-type layer 8 is then provided in the same manner on the layer 9 in a concentration of $1.5 \times 10^{15}$ arsenic atoms/ccm and a thickness of 1 $\mu$m antimony-doped which an antimon-doped layer 2, 1 $\mu$m thickness, doping $10^{18}$ atoms/ccm, is finally grown. This entire epitaxial layer structure can in principle be carried out without removing the semiconductor body from the treatment space.

Ohmic contacts in the form of vapor-deposited metal layers 6 and 3 consisting of a chromium layer which is provided immediately on the germanium and is coated with a layer of gold is then provided on the layers 5 and 2. Therewith the structure of FIG. 6 has been obtained.

Figure 6:
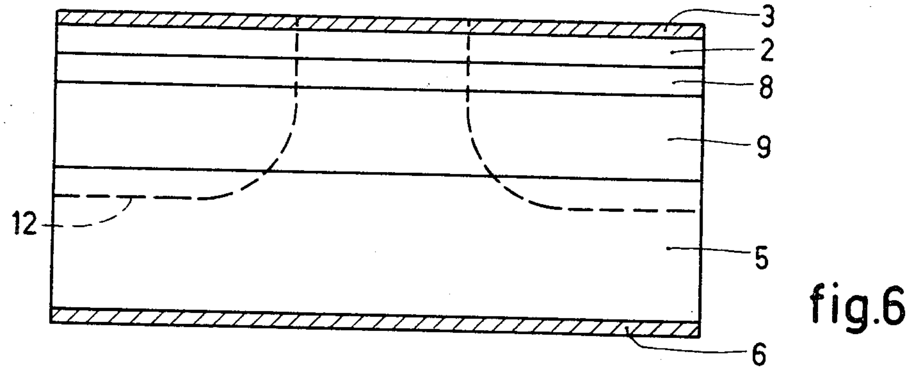
FIG. 6 shows the device of FIG. 1 in a stage of manufacture.

The effective surface area of the device is then reduced, so as to decrease the dissipation, by etching, if required combined with mechanical (for example, ultrasonic) removal of material up to the broken line 12 (see FIG. 6). The effective surface area now corresponds to that of the mesa containing the layers 9, 8 and 2, and is approximately $2.5 \times 10^{-3}$ sq. mm. The connection conductors are then provided after which the device is provided with a suitable envelope in a conventional manner.

Figure 7:
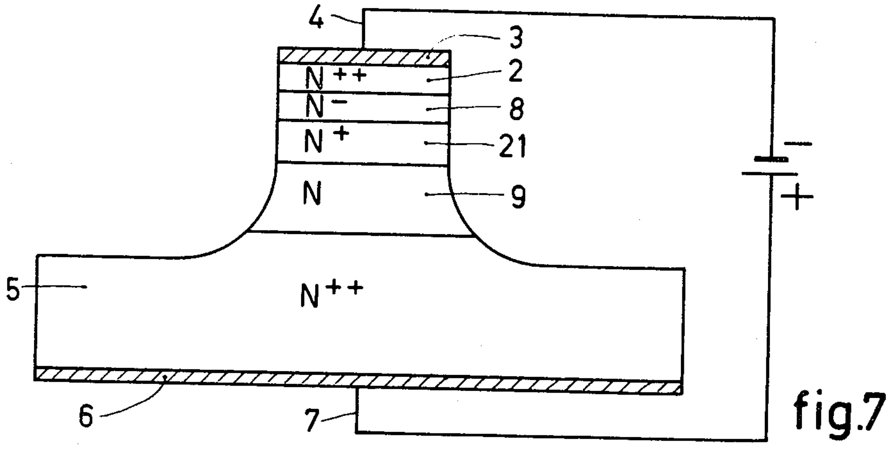
FIG. 7 shows another device according to the invention.

FIG. 7 is a diagrammatic cross-sectional view of another embodiment of a semiconductor device according to the invention. As regards dimensions and dopings this device is for the greater part similar to the device shown in FIG. 1, with the difference that the layer 9 having the higher conductivity and the layer 8 having the lower conductivity are separated from each other by an n-type intermediate layer 21, having a thickness $a$ of 2 $\mu$m and a doping concentration of $5 \cdot 10^{15}$ at/ccm. The doping concentration of this intermediate layer 21 according to the invention is higher than that of the layer 9 and lower than $\epsilon_o \epsilon_r/aq\ (E_{ar} - E_s)$ atoms/ccm, which value, according to the above-mentioned data, is approximately $7 \cdot 10^{15}$ at/ccm.

As a result of the presence of the intermediate layer 21 a slightly different field distribution occurs in the operating condition as compared with the device shown in FIG. 1. FIG. 8 is a simplified diagrammatic cross-sectional view of the device shown in FIG. 7 as a unidimensional model, FIG. 9 diagrammatically showing the doping concentration $N_D$ and the electron concentration n in the operating condition for the various layers, while in FIG. 10 this is shown for the field strength $E$ and in FIG. 11 for the potential V.

The field strength distribution and potential distribution which would occur between the metal layers 3 and 6 at the same maximum field strength if the layer 21 would have the same doping as the layer 9 (so that a structure analogous to that of FIG. 2 is obtained), are denoted by dot-and-dash lines in FIGS. 10 and 11. From these Figures it appears that as a result of the presence of the more strongly doped layer 21, the voltage drop across the device and therefore also the dissipation is considerably reduced. It is furthermore shown in FIG. 10 that throughout the space charge region the field strength remains above the saturation value $E_s$, so that the drift velocity of the electrons throughout this region has the saturation value $v$, as a result of which distortion and/or damping of the oscillations is avoided.

The device shown in FIGS. 7 to 11 can be manufactured in the same manner as has been described in connection with the preceding embodiment. It is to be noted that the layer structure may also comprise diffused layers. Another method of manufacturing which may be of particular advantage in circumstances so as to form a thin layer 8 of a lower conductivity is the so-called "remelt" method as described in Hunter "-Handbook of Semiconductor Electronics", New York 1956, pp, 7–11, section 7.4*b*, FIGS. 7,8. In this method, a low-doped layer is formed from a highly doped crystal by melting and recrystallization upon cooling of a surface layer, which low-doped layer is again more strongly doped at the surface, which is favorable for the formation of a good ohmic contact.

It will be obvious that the invention is not restricted to the examples described but that many variations are possible to those skilled in the art without departing from the scope of this invention. For example, instead of n-type structures, p-type structures may be used while reversing the polarity of the applied direct voltage. Furthermore, semiconductors other than germanium may be used, while the geometry of the semiconductor structure may also differ without departing from the scope of this invention. For example, instead of flat layers, cylindrical layers, planar structures and the like may also be used.

What is claimed is:

1. A semiconductor device for producing or amplifying electric oscillations, comprising a body of a semiconductor material selected from the group consisting of germanium and silicon and of one conductivity type and having at least two ohmic connection contacts, said body comprising between said connection contacts at least two layers of the one conductivity type and of different conductivities due to incorporated doping concentrations, the layer having the lower conductivity being thinner than the layer having the higher conductivity, the difference of the doping concentrations between at least the boundary regions of the said two layers facing each other lying in the range of $5 \times 10^8$ and $$5 \times 10^{10}\left(\frac{E_0 E_r}{q} \times \frac{E_{av}}{v}\right)$$

atoms/ccm, where $E_{av}$ is the value of the field strength in volt/cm for which the ionization degree in the said semiconductor material is equal to $1/10d$, where d is the thickness in cm of the layer having the lower conductivity, $E_o$ is the dielectric constant of vacuum in Farad/cm, $E_r$ is the relative dielectric constant of the semiconductor material, q is the charge of an electron in Coulombs, and v is the saturation drift velocity in cm/sec of the majority charge carriers, one of the connection contacts forming an ohmic connection with the layer having the lower conductivity, the other of the connection contacts forming a non-injecting ohmic connection with the layer having the higher conductivity, said semiconductor material during the production or amplification of electric oscillations being unstressed and being maintained at a temperature above 0°C and operating without the formation of Gunn domains.

2. A semiconductor device as claimed in claim 1 wherein the layer having the higher conductivity has a conductivity which is at most ten times larger than that of the layer having the lower conductivity.

3. A semiconductor device as claimed in claim 1 wherein the thickness of the layer having the lower conductivity is at most 4 $\mu$m.

4. A semiconductor device as claimed in claim 1 wherein the connection contacts are formed by semiconductor regions of the said one conductivity type and having a doping concentration which is higher than that of the layer having the higher conductivity, which regions adjoin the said layers of different conductivities.

5. A semiconductor device as claimed in claim 1 wherein the doping concentration of the layer having the higher conductivity is at most equal to $10^{16}$ at/ccm and at least equal to $10^{14}$ atoms/ccm.

6. A semiconductor device as claimed in claim 1 wherein the layer having the higher conductivity and the layer having the lower conductivity adjoin each other.

7. A semiconductor device as claimed in claim 1 wherein the layer having the higher conductivity and the layer having the lower conductivity are separated from each other by an intermediate layer of the said one conductivity type and having a doping concentration which is higher than that of the layer having the higher conductivity and lower than $\epsilon_o \epsilon_r/aq (E_{av} - E_s)$ atoms/ccm, where $E_s$ is the value of the field strength in volt/cm for which saturation of the drift velocity of the majority charge carriers is reached and a is the thickness of the intermediate layer in cm.

8. A circuit arrangement comprising a semiconductor device as claimed in claim 1 wherein means are provided for applying a direct voltage between the connection contacts with a polarity such that in the semiconductor body majority charge carriers flow from the layer having the lower conductivity to the layer having the higher conductivity.

9. A circuit arrangement as claimed in claim 8 wherein the applied direct voltage is so high that the drift velocity of the majority charge carriers, at least in the layer having the lower conductivity, reaches its saturation value and the ionization degree in said layer assumes a value which lies between 1 and 10.

10. A circuit arrangement as claimed in claim 8 wherein the applied direct voltage is variable so as to control the oscillation frequency.

* * * * *